United States Patent
Nakao et al.

(10) Patent No.: US 11,706,951 B2
(45) Date of Patent: Jul. 18, 2023

(54) OLED INCLUDING INTER-PIXEL SECTIONS HAVING DIFFERENT RESISTANCES

(71) Applicant: Japan Display Inc., Tokyo (JP)

(72) Inventors: Kenji Nakao, Minato-ku (JP); Hiroshi Tabatake, Minato-ku (JP); Akihito Sato, Minato-ku (JP)

(73) Assignee: Japan Display Inc., Tokyo (JP)

( * ) Notice: Subject to any disclaimer, the term of this patent is extended or adjusted under 35 U.S.C. 154(b) by 85 days.

(21) Appl. No.: 17/018,731

(22) Filed: Sep. 11, 2020

(65) Prior Publication Data

US 2021/0083025 A1 Mar. 18, 2021

(30) Foreign Application Priority Data

Sep. 13, 2019 (JP) ................................. 2019-167606

(51) Int. Cl.
*H01L 27/32* (2006.01)
*H10K 59/122* (2023.01)
*H10K 59/35* (2023.01)

(52) U.S. Cl.
CPC ......... *H10K 59/122* (2023.02); *H10K 59/353* (2023.02); *H10K 59/352* (2023.02)

(58) Field of Classification Search
CPC ............. H01L 27/3246; H01L 27/3218; H01L 27/321
See application file for complete search history.

(56) References Cited

U.S. PATENT DOCUMENTS

| | | | |
|---|---|---|---|
| 2016/0118449 A1 | 4/2016 | Sato et al. | |
| 2016/0155785 A1 | 6/2016 | Sato | |
| 2018/0180951 A1* | 6/2018 | Toyotaka | ............ H01L 27/3204 |
| 2019/0333450 A1* | 10/2019 | Liu | ........................ H10K 59/35 |
| 2021/0359247 A1* | 11/2021 | Wang | ................... H10K 59/122 |

FOREIGN PATENT DOCUMENTS

| | | | | |
|---|---|---|---|---|
| CN | 108987442 A | * | 12/2018 | .......... H01L 27/3211 |
| JP | 2016-085913 A | | 5/2016 | |
| JP | 2016-103395 A | | 6/2016 | |

* cited by examiner

*Primary Examiner* — Peter Bradford
(74) *Attorney, Agent, or Firm* — Maier & Maier, PLLC

(57) ABSTRACT

The first light-emitting layer is higher in light-emission start voltage than each of the second light-emitting layer and the third light-emitting layer. The second light-emitting layer is higher in visibility of the emission color than each of the first light-emitting layer and the third light-emitting layer. The electroluminescence layer has an inter-pixel section between an adjacent pair of the openings and along the upper surface of the insulation layer. The inter-pixel section between the first opening and the second opening has a first resistance value. The inter-pixel section between the second opening and the third opening has a second resistance value. The inter-pixel section between the third opening and the first opening has a third resistance value. The first resistance value is larger than each of the second resistance value and the third resistance value.

8 Claims, 11 Drawing Sheets

OLED INCLUDING INTER-PIXEL SECTIONS HAVING DIFFERENT RESISTANCES

CROSS-REFERENCE TO RELATED APPLICATION

The present application claims priority from Japanese patent application JP2019-167606 filed on Sep. 13, 2019, the content of which is hereby incorporated by reference into this application.

BACKGROUND

1. Field

This relates to a display device.

2. Description of the Related Art

Recently, a display device has so many pixels that neighboring pixels are closer to each other. An organic electroluminescence display, which has light-emitting layers separated for the respective pixels, may have a continuous layer (e.g. hole transport layer) over all pixels, whereby leakage current flowing through the continuous layer causes an adjacent light-emitting layer to emit light (JP 2016-103395A and JP 2016-85913A).

A full-color pixel consists of sub-pixels in some emission colors such as red (R), green (G), and blue (B). Light emission at a sub-pixel, to which no signal is input but through which the leakage current flows, deteriorates color purity of monochromatic light emitted at the full-color pixel. Specifically, higher voltage needs to be applied to the light-emitting layer of B, due to higher light-emission start voltage, thereby making it easier to emit light at adjacent light-emitting layers of G and R. Lower color purity poses more problems on lighting at a lower gradation, having a greater impact by light emission of G with higher visibility.

SUMMARY

This is to aim at minimizing deterioration of color purity.

A display device includes a plurality of pixel electrodes; an insulation layer with a plurality of openings for the respective plurality of pixel electrodes, the insulation layer covering a peripheral portion of each of the plurality of pixel electrodes; and an electroluminescence layer on an upper surface of the insulation layer, the electroluminescence layer including a plurality of light-emitting layers, the plurality of light-emitting layers overlapping with the respective plurality of pixel electrodes inside the respective plurality of openings. The plurality of light-emitting layers include a first light-emitting layer, a second light-emitting layer, and a third light-emitting layer that are different in emission color and are adjacent to each other. The first light-emitting layer is higher in light-emission start voltage than each of the second light-emitting layer and the third light-emitting layer. The second light-emitting layer is higher in visibility of the emission color than each of the first light-emitting layer and the third light-emitting layer. The plurality of openings include a first opening overlapping with the first light-emitting layer, a second opening overlapping with the second light-emitting layer, and a third opening overlapping with the third light-emitting layer. The electroluminescence layer has an inter-pixel section between each adjacent pair of the openings and along the upper surface of the insulation layer. The inter-pixel section between the first opening and the second opening has a first resistance value, the inter-pixel section between the second opening and the third opening has a second resistance value, and the inter-pixel section between the third opening and the first opening has a third resistance value. The first resistance value is larger than each of the second resistance value and the third resistance value.

The first resistance value is large between the first light-emitting layer with high light-emission start voltage and the second light-emitting layer with high visibility of emission color, thereby suppressing leakage current and minimizing deterioration of color purity.

DETAILED DESCRIPTION

Figure 1:
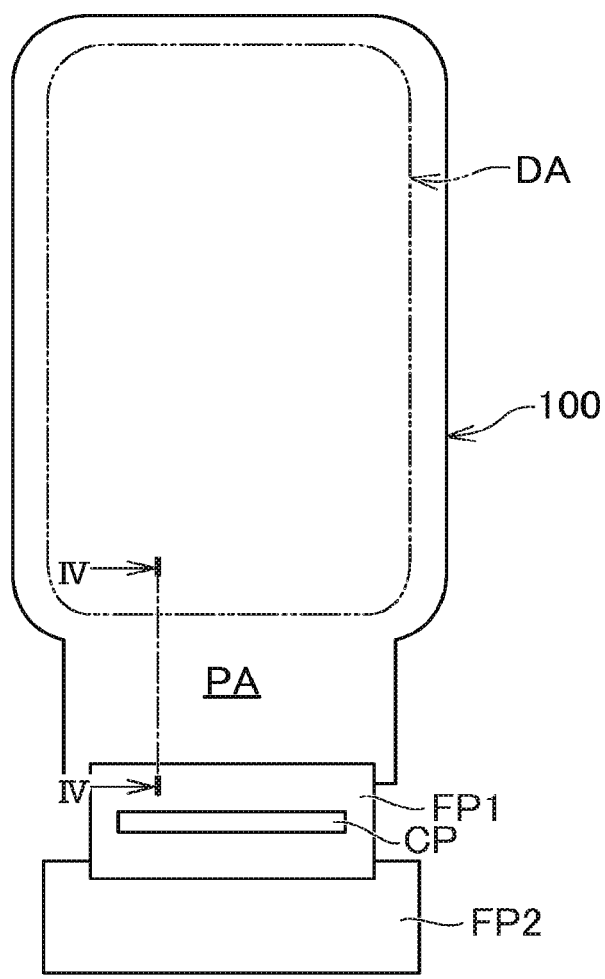
FIG. 1 is a plan view of a display device in a first embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

Figure 2:
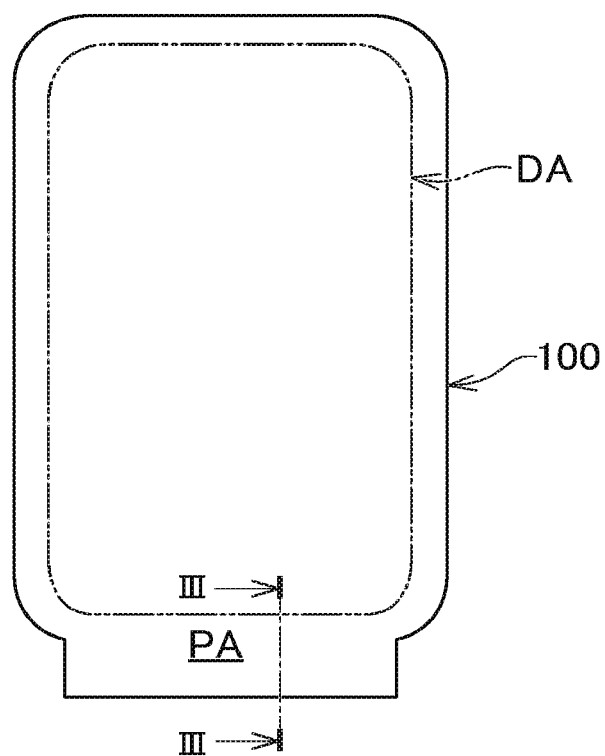
FIG. 2 is a schematic view of usage of the display device.
Figure 3:
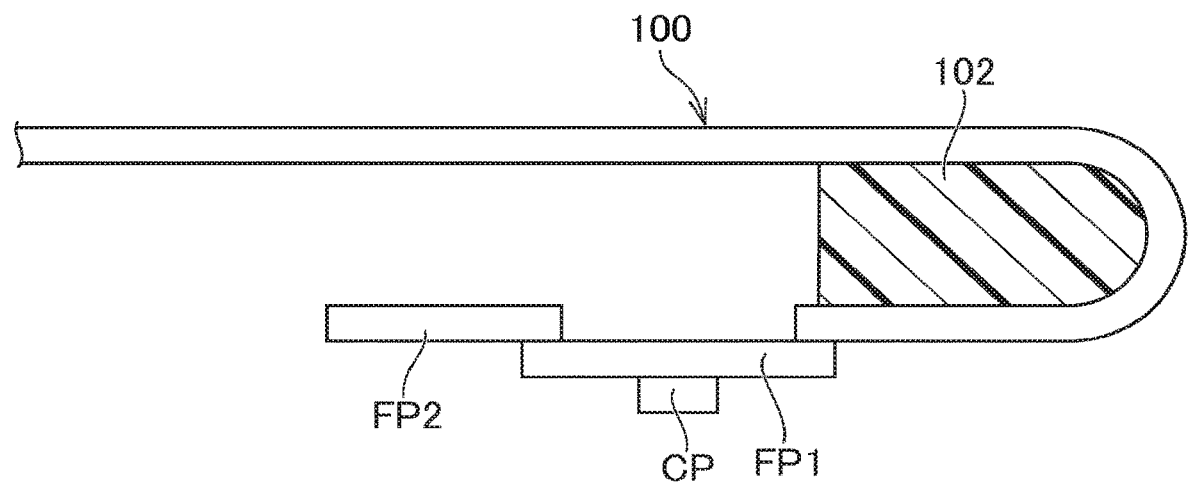
FIG. 3 is a III-III line cross section schematic view of the display device in FIG. 2.

FIG. 1 is a plan view of a display device in a first embodiment. The display device is actually folded to be used. FIG. 1 is a developed view of the display device before it is folded. FIG. 2 is a schematic view of usage of the display device. FIG. 3 is a III-III line cross section schematic view of the display device in FIG. 2.

The display device may be an organic electroluminescence display device. The display device has a display area DA for displaying images. The display area DA displays a full-color image by forming full-color pixels, each of which consists of unit pixels (subpixels) in some colors such as red, green, and blue.

The display device includes a display 100. There is a spacer 102 inside curvature, preventing the display 100 from being bent too much. The display 100 has flexibility and is folded (in a peripheral area PA) outside a display area DA. A first flexible printed circuit board FP1 is connected to the display 100 at the peripheral area PA. An integrated circuit chip CP is mounted on the first flexible printed circuit board FP1 for driving image displaying elements. Additionally, a second flexible printed circuit board FP2 is connected to the first flexible printed circuit board FP1.

Figure 4:
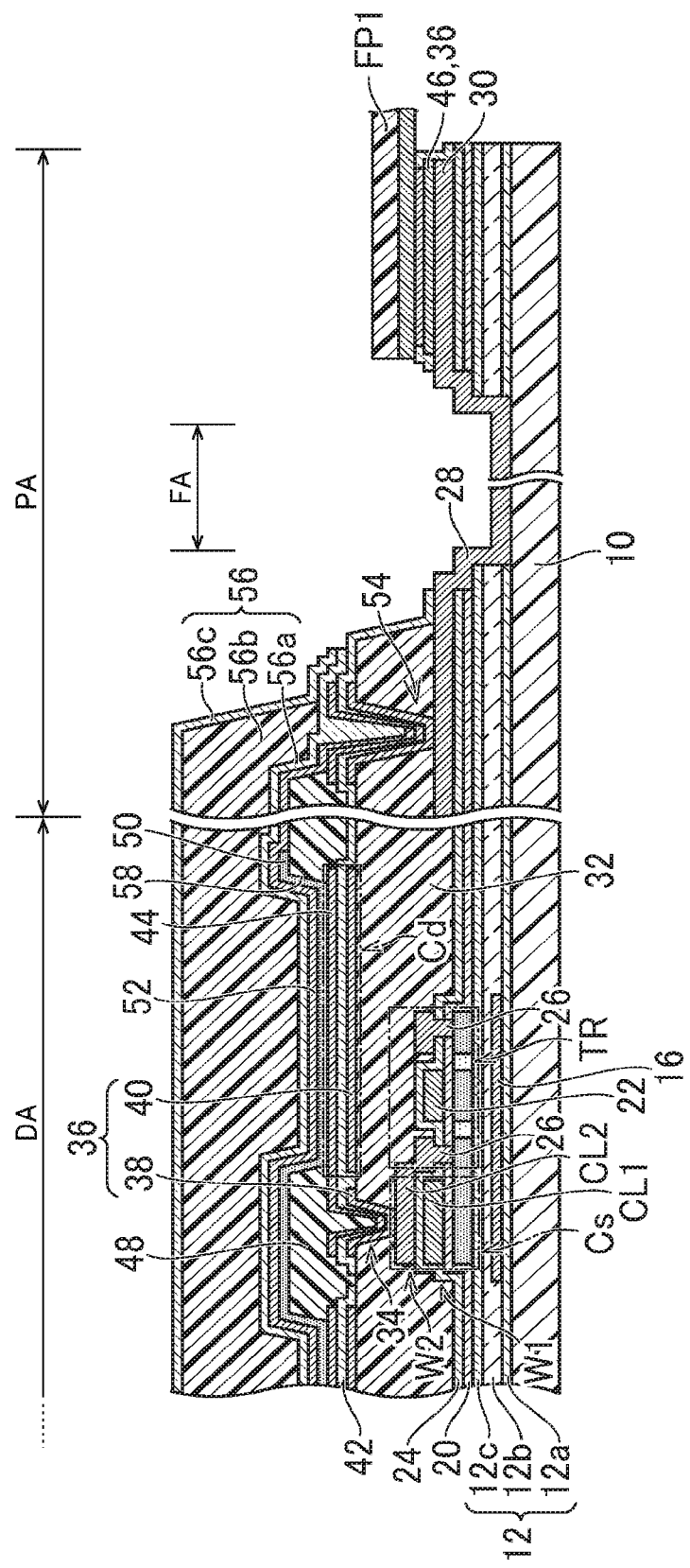
FIG. 4 is a IV-IV line cross-sectional view of the display device in FIG. 1.

FIG. 4 is a IV-IV line cross-sectional view of the display device in FIG. 1. Material of a substrate 10 (array substrate) is polyimide. Or, other resin materials can be used as long as the materials have satisfactory flexibility for forming a sheet display or a flexible display.

A three-layer laminated structure of a silicon oxide film 12a, a silicon nitride film 12b, and a silicon oxide film 12c is disposed on the substrate 10, for an undercoat layer 12. The silicon oxide film 12a of the lowest layer is for improving close-fitting properties with the substrate 10, the silicon nitride film 12b of a middle layer is a blocking film from external moisture and impurities, the silicon oxide film 12c of the uppermost layer is for another blocking film to prevent hydrogen atoms in the silicon nitride film 12b from diffusing on a side of a semiconductor layer 18 of a thin film transistor TR, but such a structure is not essential and an additional laminate, a single layer or a two-layer laminate, is applicable thereto.

An additional film 16 may be formed under the undercoat layer 12 and in an area where the thin film transistor TR is formed. The additional film 16 may suppress characteristic change of the thin film transistor TR due to light intrusion from a channel back, or may provide the thin film transistor TR with a backgating effect by being formed from conductive material to apply a certain potential. In the embodiment, after the silicon oxide film 12a is formed, the additional film 16 is formed in an island shape corresponding to the area where the thin film transistor TR is formed, and then the silicon nitride film 12b and the silicon oxide film 12c are laminated, whereby the additional film 16 is sealed in the undercoat layer 12, alternatively, the additional film 16 may be formed on the substrate 10, prior to forming the undercoat layer 12.

The thin film transistor TR is on the undercoat layer 12. A polysilicon thin film transistor is an example and only an N-ch transistor is herein illustrated, but a P-ch transistor may be simultaneously formed. The semiconductor layer 18 of the thin film transistor TR has a structure where a low concentration impurity area is provided between a channel area and a source/drain area. A silicon oxide film is herein used for a gate insulation film 20. A gate electrode 22 is part of a first wiring layer W1 made from molybdenum tungsten alloys. The first wiring layer W1 includes a first storage capacitor line CL1 in addition to the gate electrode 22. Part of a storage capacitor Cs is formed between the first storage capacitor line CL1 and the semiconductor layer 18 (source/drain area) with the gate insulation film 20 interposed therebetween.

There is an interlayer dielectric 24 (silicon oxide film and silicon nitride film) laminated on the gate electrode 22. For bending the substrate 10, at least part of the interlayer dielectric 24 is removed to make a folding area FA more foldable. Removal of the interlayer dielectric 24 can expose the undercoat layer 12, and at least part of it is removed by patterning. After removing the undercoat layer 12, polyimide constituting the substrate 10 is exposed. During etching the undercoat layer 12, a polyimide surface may be partially eroded and a film thickness may decrease.

A second wiring layer W2, including portions for a source/drain electrode 26 and a leading line 28, is on the interlayer dielectric 24. A three-layer laminated structure of titanium, aluminum, and titanium is herein employed. The first storage capacitor line CL1 (part of the first wiring layer W1) and a second storage capacitor line CL2 (part of the second wiring layer W2), through the interlayer dielectric 24, constitute another part of the storage capacitor Cs. The leading line 28 extends to an edge of the substrate 10 and has a terminal 30 for connecting to the first flexible printed circuit board FP1.

A planarization layer 32 is formed to cover the source/drain electrode 26 and the leading line 28 (except for their part). The planarization layer 32 is formed from organic materials such as photosensitive acrylic because of superior surface flatness to inorganic insulation materials used in CVD (Chemical Vapor Deposition).

The planarization layer 32 is removed on a pixel contact portion 34 and the peripheral area PA, and an indium tin oxide (ITO) film 36 is formed thereon. The indium tin oxide film 36 includes a first transparent conductive film 38 and a second transparent conductive film 40 separated from each other.

By removing the planarization layer 32, the second wiring layer W2 has an exposed surface and is covered with the first transparent conductive film 38. A silicon nitride film 42 is on the planarization layer 32, covering the first transparent conductive film 38. The silicon nitride film 42 has an opening at the pixel contact portion 34, whereby a pixel electrode 44 is laminated on and connected to the source/drain electrode 26 through the opening. The pixel electrode 44 is a reflective electrode and has a three-layer laminated structure of an indium zinc oxide film, a silver film, and an indium zinc oxide film. The indium zinc oxide film may be herein replaced with an indium tin oxide film. The pixel electrode 44 extends laterally from the pixel contact portion 34 and to above the thin film transistor TR.

The second transparent conductive film 40 is adjacent to the pixel contact portion 34 and under the pixel electrode 44 (further below the silicon nitride film 42). The second transparent conductive film 40, the silicon nitride film 42, and pixel electrode 44 overlap with one another, thereby forming an additional capacitance Cd.

A third transparent conductive film 46, which is another part of the indium tin oxide film 36, is formed on a surface of the terminal 30. The third transparent conductive film 46 is formed at the same time as the first transparent conductive film 38 and the second transparent conductive film 40 are formed. The third transparent conductive film 46 on the terminal 30 serves as a barrier film to prevent an exposed portion of the terminal from being damaged during subsequent processes. During patterning the pixel electrodes 44, the third transparent conductive film 46 is exposed to etching environment, but the indium tin oxide film 36 has satisfactory tolerance to etching of the pixel electrodes 44, due to annealing from the time of forming the indium tin oxide film 36 and until the time of forming the pixel electrodes 44.

An insulation layer 48, which is called a bank (rib) for a partition of adjacent pixel areas, is on the planarization layer 32 and over the pixel contact portion 34, for example. Photosensitive acrylic may be used for the insulation layer 48 just like the planarization layer 32. The insulation layer 48 has an opening 58 for exposing a surface of the pixel electrode 44 as a light-emitting region, and the opening 58 should have an edge in a gently tapered shape. A steep shape of the opening 58 may cause coverage inferiority of an electroluminescence layer formed thereon. The insulation layer 48 covers a peripheral portion of each pixel electrode 44.

The planarization layer 32 and the insulation layer 48 are in contact with each other through an opening in the silicon nitride film 42 between them. This makes it possible to remove moisture and gas desorbed from the planarization layer 32 through the insulation layer 48 during heat treatment after the insulation layer 48 is formed.

An electroluminescence layer 50 made from organic materials is laminated on the pixel electrodes 44. The electroluminescence layer 50 is also on an upper surface of the insulation layer 48. A counter electrode 52 is on the electroluminescence layer 50. Due to a top emission structure being employed herein, the counter electrode 52 is transparent. A magnesium layer and a silver layer may be formed to be as thin a film as outgoing light from the electroluminescence layer 50 can pass. In comply with the forming order of the electroluminescence layer 50, the pixel electrode 44 is an anode, and the counter electrode 52 is a cathode. The counter electrode 52 is formed over the display area DA and on a cathode contact portion 54 near the display area DA, is connected to the leading line 28 under it at the cathode contact portion 54, and is electrically connected to the terminal 30.

There is a sealing film 56 on the counter electrode 52. The sealing film 56 may serve to prevent external moisture intrusion into the electroluminescence layer 50 formed thereunder, requiring high gas barrier properties. The sealing film 56 has a laminated structure, including a silicon nitride film, where a silicon nitride film 56a, a resin film 56b, and a silicon nitride film 56c are laminated. There may be a silicon oxide film or an amorphous silicon layer between each of silicon nitride films 56a, 56c and the resin film 56b, for improving close-fitting properties.

A cover glass or a touch panel substrate may be placed on the sealing film 56, if necessary. Voids between the sealing film 56 and the cover glass or the touch panel may be filled with filler such as resin.

Figure 5:
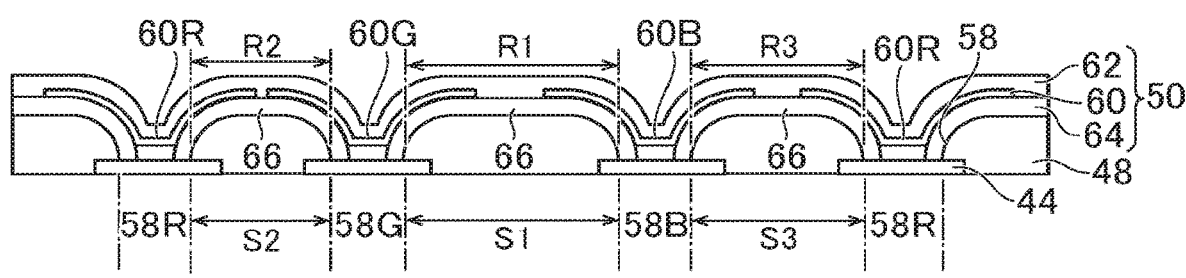
FIG. 5 is a detailed view of a plurality of openings of an insulation layer and electroluminescence layer.
Figure 6:
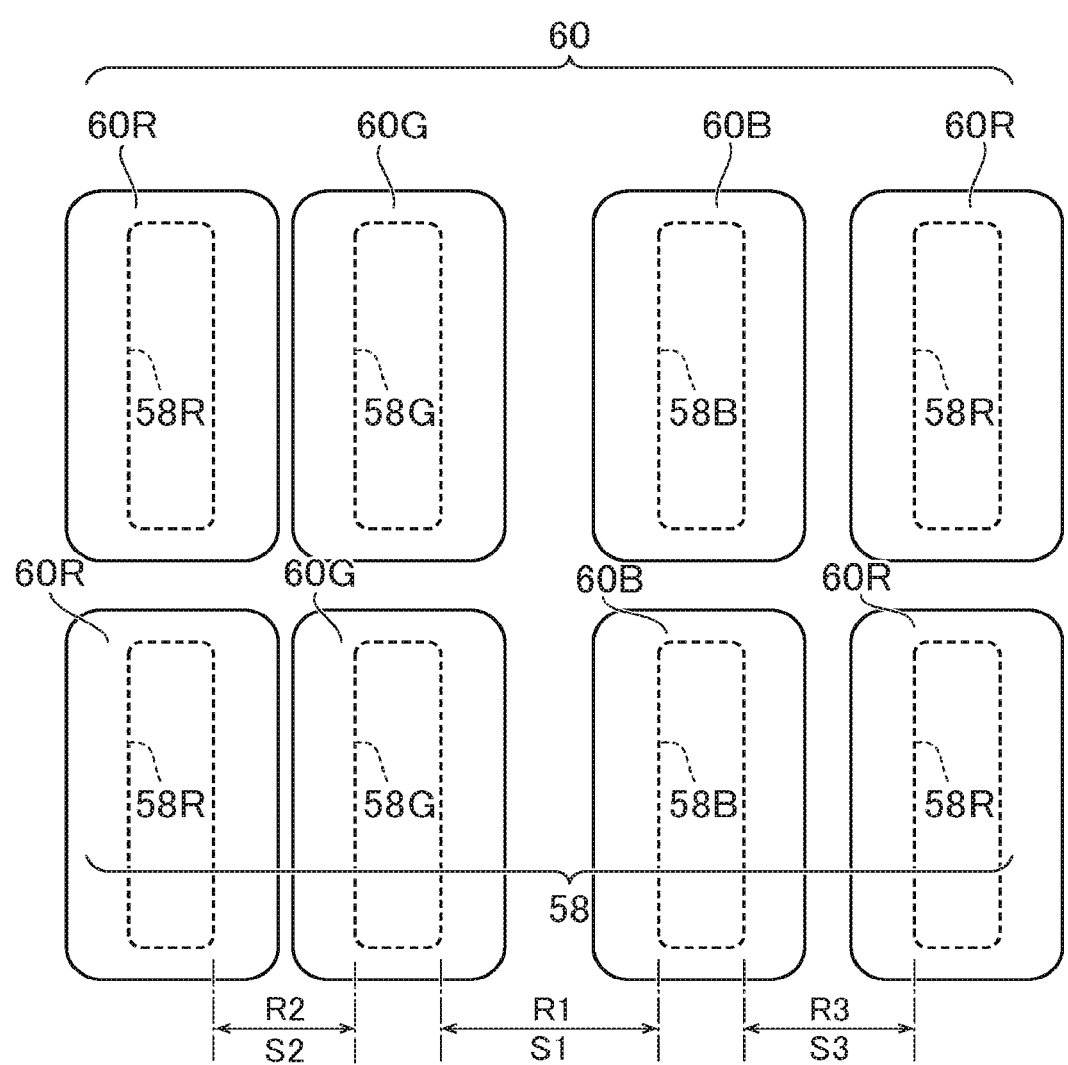
FIG. 6 is a plan view of the plurality of openings and a plurality of light-emitting layers.

FIG. 5 is a detailed view of the plurality of openings 58 of the insulation layer 48 and the electroluminescence layer 50. FIG. 6 is a plan view of the plurality of openings 58 and the plurality of light-emitting layers 60. The insulation layer 48 has a plurality of openings 58 for the respective plurality of pixel electrodes 44. The electroluminescence layer 50 includes a plurality of light-emitting layers 60.

The plurality of light-emitting layers 60 overlap with the respective plurality of pixel electrodes 44 inside the respective plurality of openings 58. The plurality of light-emitting layers 60 are different in emission color and include a first light-emitting layer 60B, a second light-emitting layer 60G, and a third light-emitting layer 60R that are adjacent to each other. The emission color is blue in the first light-emitting layer 60B. The emission color is green in the second light-emitting layer 60G. The emission color is red in the third light-emitting layer 60R.

The first light-emitting layer 60B is higher in light-emission start voltage than each of the second light-emitting layer 60G and the third light-emitting layer 60R. The second light-emitting layer 60G is higher in visibility of the emission color than each of the first light-emitting layer 60B and the third light-emitting layer 60R.

The plurality of openings 58 include a first opening 58B overlapping with the first light-emitting layer 60B, a second opening 58G overlapping with the second light-emitting layer 60G, and a third opening 58R overlapping with the third light-emitting layer 60R. There is a first distance S1 between the first opening 58B and the second opening 58G. There is a second distance S2 between the second opening 58G and the third opening 58R. There is a third distance S3 between the third opening 58R and the first opening 58B. The first distance S1 is larger than each of the second distance S2 and the third distance S3.

The electroluminescence layer 50 includes an upper common layer 62 on the plurality of light-emitting layers 60 and in contact with the counter electrode 52 (FIG. 4). The upper common layer 62 is an electron injection layer and an electron transport layer, if the counter electrode 52 is the cathode.

The electroluminescence layer 50 includes a lower common layer 64 under the plurality of light-emitting layers 60 and in contact with the plurality of pixel electrodes 44. The lower common layer 64 is a hole transport layer and a hole transport layer, if the pixel electrode 44 is the anode.

The electroluminescence layer 50 has an inter-pixel section 66 between an adjacent pair of openings 58 and along the upper surface of the insulation layer 48. The inter-pixel section 66 is part of the lower common layer 64. The inter-pixel section 66 between the first opening 58B and the second opening 58G has a first resistance value R1. The inter-pixel section 66 between the second opening 58G and the third opening 58R has a second resistance value R2. The inter-pixel section 66 between the third opening 58R and the first opening 58B has a third resistance value R3. The first resistance value R1 is larger than each of the second resistance value R2 and the third resistance value R3.

In the embodiment, the first resistance value R1 is large between the first light-emitting layer 60B with high light-emission start voltage and the second light-emitting layer 60G with high visibility of the emission color, (at the first distance S1), thereby suppressing leakage current and minimizing deterioration of color purity.

Second Embodiment

Figure 7:
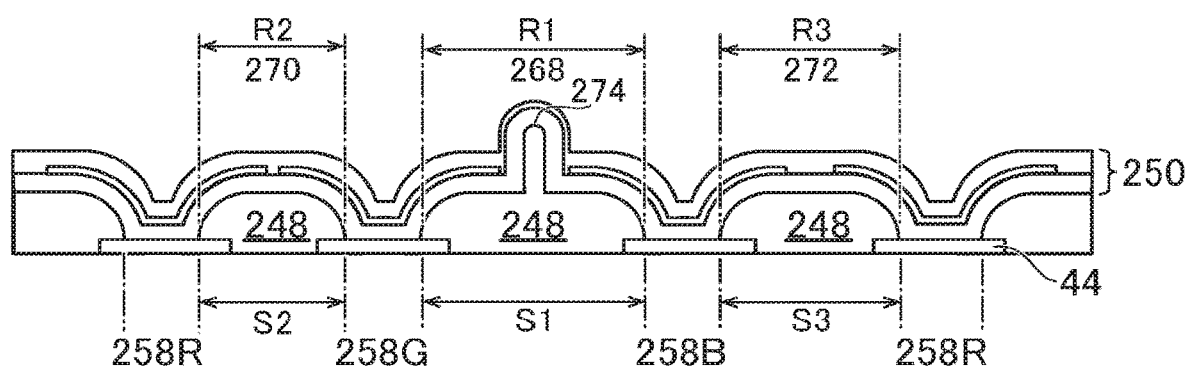
FIG. 7 is a detailed view of a plurality of openings of an insulation layer and an electroluminescence layer in a second embodiment.

FIG. 7 is a detailed view of a plurality of openings of an insulation layer and an electroluminescence layer in a second embodiment.

The insulation layer 248, on the surface on which the electroluminescence layer 250 is disposed, has a first area 268 between the first opening 258B and the second opening 258G. The insulation layer 248, on the surface on which the electroluminescence layer 250 is disposed, has a second area 270 between the second opening 258G and the third opening 258R. The insulation layer 248, on the surface on which the electroluminescence layer 250 is disposed, has a third area 272 between the third opening 258R and the first opening 258B.

The surface of the insulation layer 248 has at least one of a projection 274 or a recess in the first area 268 excluding the second area 270 and the third area 272. This makes the surface of the insulation layer 248 wider and the electroluminescence layer 250 longer, whereby the first resistance value R1 is made larger. What is explained in the first embodiment is applicable to other details.

Third Embodiment

Figure 8:
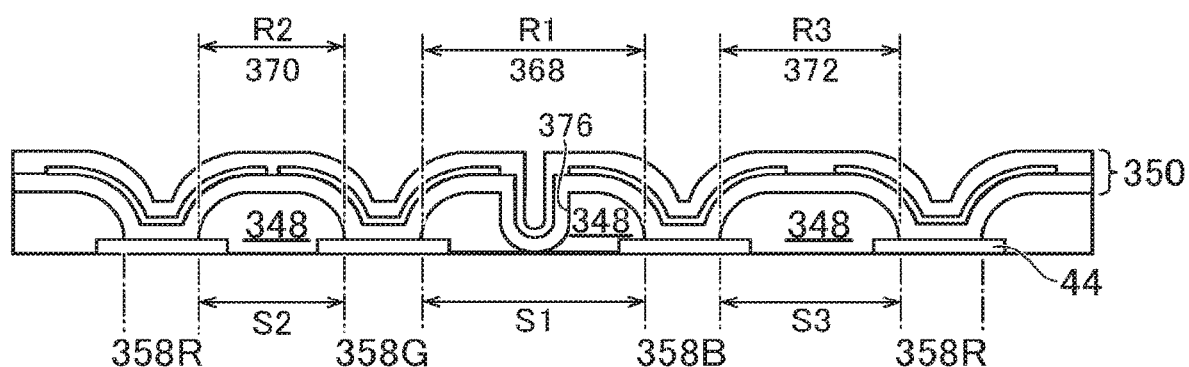
FIG. 8 is a detailed view of a plurality of openings of an insulation layer and an electroluminescence layer in a third embodiment.

FIG. 8 is a detailed view of a plurality of openings of an insulation layer and an electroluminescence layer in a third embodiment.

The insulation layer 348, on the surface on which the electroluminescence layer 350 is disposed, has the first area 368 between the first opening 358B and the second opening 358G. The insulation layer 348, on the surface on which the electroluminescence layer 350 is disposed, has the second area 370 between the second opening 358G and the third opening 358R. The insulation layer 348, on the surface on which the electroluminescence layer 350 is disposed, has the third area 372 between the third opening 358R and the first opening 358B.

The surface of the insulation layer 348 has at least one of a projection or a recess 376 in the first area 368 excluding the second area 370 and the third area 372. This makes the surface of the insulation layer 348 wider and the electroluminescence layer 350 longer, whereby the first resistance value R1 is made larger. What is explained in the first embodiment is applicable to other details.

Fourth Embodiment

Figure 9:
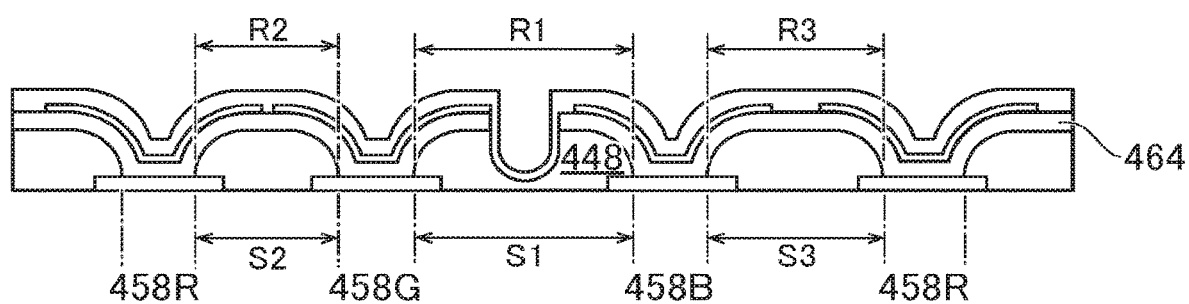
FIG. 9 is a detailed view of a plurality of openings of an insulation layer and an electroluminescence layer in a fourth embodiment.

FIG. 9 is a detailed view of a plurality of openings of an insulation layer and an electroluminescence layer in a fourth embodiment.

The lower common layer 464 is continuous between the second opening 458G and the third opening 458R. The lower common layer 464 is continuous between the third opening 458R and the first opening 458B. By contrast, the lower common layer 464 is discontinuous between the first opening 458B and the second opening 458G. This makes the first resistance value R1 larger. For example, the lower common layer 464 is continuously formed on the insulation layer 448, and then its part is etched. The insulation layer 448 is etched at the same time as the lower common layer 464 is etched. What is explained in the first embodiment is applicable to other details.

Fifth Embodiment

Figure 10:
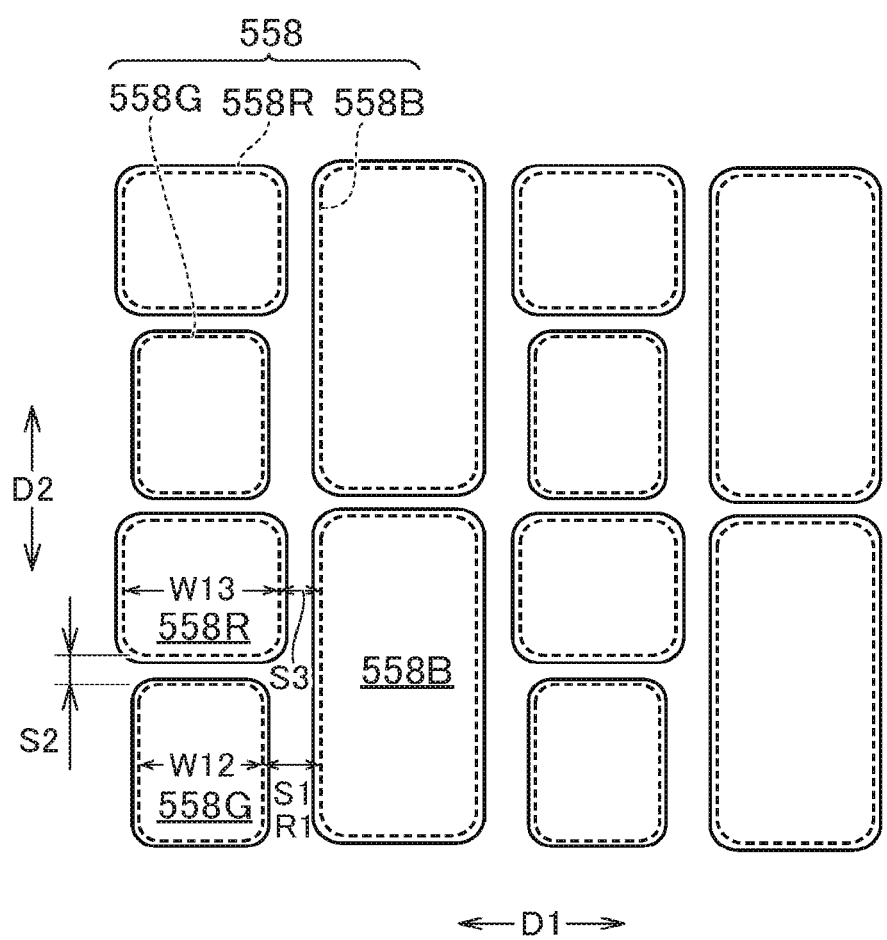
FIG. 10 is a plan view of arrangement of a plurality of openings in a fifth embodiment.

FIG. 10 is a plan view of arrangement of a plurality of openings in a fifth embodiment. The plurality of openings 558 are arranged in the first direction D1 and the second direction D2 that are perpendicular to each other.

The first opening 558B and the second opening 558G are adjacent to each other in the first direction D1. The first opening 558B and the third opening 558R are adjacent to each other in the first direction D1. The second opening 558G and the third opening 558R are adjacent to each other in the second direction D2.

The second opening 558G, along the first direction D1, has a width W12 that is smaller than a width W13 of the third opening 558R. Accordingly, the first distance S1 (between the first opening 558B and the second opening 558G) is larger than each of the second distance S2 (between the second opening 558G and the third opening 558R) and the third distance S3 (between the third opening 558R and the first opening 558B). This makes the first resistance value R1 larger. What is explained in the first embodiment is applicable to other details.

Sixth Embodiment

Figure 11:
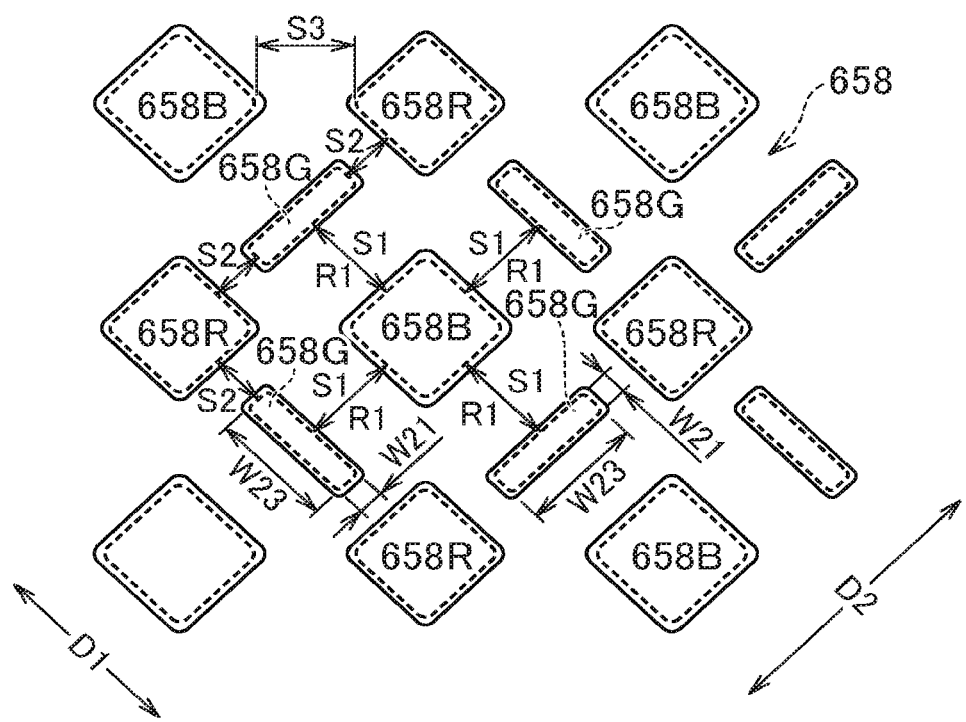
FIG. 11 is a plan view of arrangement of a plurality of openings in a sixth embodiment.

FIG. 11 is a plan view of arrangement of a plurality of openings in a sixth embodiment. The plurality of openings 658 are arranged in the first direction D1 and the second direction D2 that are perpendicular to each other. Some first openings 658B and some third opening 658Rs are alternately arranged in a rotation direction around each second opening 658G.

The plurality of openings 658 include a plurality of second openings 658G. There are two types of second openings 658G. The first type of second opening 658G is adjacent to the first opening 658B in the first direction D1 and is adjacent to the third opening 658R in the second direction D2. The second type of second opening 658G is adjacent to the third opening 658R in the first direction D1 and is adjacent to the first opening 658B in the second direction D2.

Either type of second opening 658G has a smaller width W21 in a direction toward the first opening 658B than a width W23 in another direction toward the third opening 658R. Thus, the first distance S1 (between the first opening 658B and the second opening 658G) is larger than each of the second distance S2 (between the second opening 658G and the third opening 658R) and the third distance S3 (between the third opening 658R and the first opening 658B). This makes the first resistance value R1 larger. What is explained in the first embodiment is applicable to other details.

While there have been described what are at present considered to be certain embodiments, it will be understood that various modifications may be made thereto, and it is intended that the appended claims cover all such modifications as fall within the true spirit and scope of the invention.

What is claimed is:
1. A display device comprising:
a plurality of pixel electrodes;
an insulation layer with a plurality of openings for the respective plurality of pixel electrodes, the insulation layer covering a peripheral portion of each of the plurality of pixel electrodes; and
an electroluminescence layer on an upper surface of the insulation layer, the electroluminescence layer including a plurality of light-emitting layers, the plurality of light-emitting layers overlapping with the respective plurality of pixel electrodes inside the respective plurality of openings,
wherein
the plurality of light-emitting layers include a first light-emitting layer configured to emit blue light, a second light-emitting layer configured to emit green light, and a third light-emitting layer configured to emit red light, and the plurality of light-emitting layers are adjacent to each other,
the first light-emitting layer is higher in a voltage to start light-emission than each of the second light-emitting layer and the third light-emitting layer,
the plurality of openings include a first opening overlapping with the first light-emitting layer, a second opening overlapping with the second light-emitting layer, and a third opening overlapping with the third light-emitting layer, the electroluminescence layer includes a plurality of inter-pixel sections including an inter-pixel section between each adjacent pair of the openings and along the upper surface of the insulation layer, the inter-pixel section between the first opening and the second opening has a first electrical resistance value, the inter-pixel section between the second opening and the third opening has a second electrical resistance value, and the inter-pixel section between the third opening and the first opening has a third electrical resistance value, and the first electrical resistance value is larger than each of the second electrical resistance value and the third electrical resistance value.

2. The display device according to claim 1, wherein the electroluminescence layer includes a common layer under the plurality of light-emitting layers and in contact with the plurality of pixel electrodes, and
the inter-pixel section is part of the common layer.

3. The display device according to claim 2, wherein the common layer is discontinuous between the first opening and the second opening, continuous between the second opening and the third opening, and continuous between the third opening and the first opening.

4. The display device according to claim 1, wherein the insulation layer, on a surface on which the electroluminescence layer is disposed, has a first area between the first opening and the second opening, a second area between the second opening and the third opening, a third area between the third opening and the first opening, and
the surface has at least one of a projection or a recess, in the first area.

5. The display device according to claim 1, wherein there is a first distance between the first opening and the second opening,
there is a second distance between the second opening and the third opening,
there is a third distance between the third opening and the first opening, and
the first distance is larger than each of the second distance and the third distance.

6. The display device according to claim 1, wherein the plurality of openings are arranged in a first direction and a second direction that are perpendicular to each other,
the first opening and the second opening are next to each other in the first direction,
the first opening and the third opening are next to each other in the first direction,
the second opening and the third opening are next to each other in the second direction, and
the second opening is smaller in width along the first direction than the third opening.

7. The display device according to claim 1, wherein the first opening includes a plurality of first openings and the third opening includes a plurality of third openings, and the plurality of first openings are along a first axis and the plurality of third openings are along a second axis, and the first and third openings are alternately arranged around the second opening, and
the second opening is smaller in width along a direction of the first axis toward each of the first openings than along another direction of the second axis toward each of the third openings.

8. The display device according to claim 7, wherein the second opening includes a plurality of second openings,
a first set of the second openings are adjacent to the first openings in the direction of the first axis and adjacent to the third openings in the direction of the second axis, and
a second set of the second openings are adjacent to the third openings in the direction of the first axis and adjacent to the first openings in the direction of the second axis.

\* \* \* \* \*